United States Patent
Wang et al.

(10) Patent No.: US 7,779,322 B1
(45) Date of Patent: Aug. 17, 2010

(54) COMPACTING TEST RESPONSES USING X-DRIVEN COMPACTOR

(75) Inventors: Zhigang Wang, Sunnyvale, CA (US); Laung-Terng (L.-T.) Wang, Sunnyvale, CA (US); Shianling Wu, Princeton Junction, NJ (US); Xiaoqing Wen, Fukuoka (JP); Boryau (Jack) Sheu, San Jose, CA (US); Zhigang Jiang, San Jose, CA (US)

(73) Assignee: Syntest Technologies, Inc., Sunnyvale, CA (US)

( * ) Notice: Subject to any disclaimer, the term of this patent is extended or adjusted under 35 U.S.C. 154(b) by 390 days.

(21) Appl. No.: 11/898,070

(22) Filed: Sep. 7, 2007

Related U.S. Application Data

(60) Provisional application No. 60/844,390, filed on Sep. 14, 2006.

(51) Int. Cl.
  *G01R 31/28* (2006.01)
(52) U.S. Cl. .................................. 714/729; 714/732
(58) Field of Classification Search .................. None
  See application file for complete search history.

(56) References Cited

U.S. PATENT DOCUMENTS

| | | | | |
|---|---|---|---|---|
| 5,757,809 A | * | 5/1998 | Kiso et al. | 714/718 |
| 7,302,624 B2 | * | 11/2007 | Rajski et al. | 714/732 |
| 7,370,254 B2 | | 5/2008 | Rajski et al. | |
| 7,500,163 B2 | * | 3/2009 | Rajski et al. | 714/729 |
| 2005/0097419 A1 | | 5/2005 | Rajski et al. | |

OTHER PUBLICATIONS

K. K. Saluja and M. Karpovsky, "Testing Computer Hardware Through Data Compression in Space and Time," Proc. IEEE Int'l. Test Conf., pp. 83-88, 1983.
S. Mitra and K.S. Kim, "X-Compact: An Efficient Response Compaction Technique," IEEE Trans. On Computer-Aided Design, vol. 23, No. 3, pp. 421-432, Mar. 2004.
P. Wohl, J.A. Waicukauski, and S. Patel, "Scalable Selector Architecture for X-Tolerant Deterministic BIST," Proc. Design Automation Conf., pp. 934-939, 2004.
J. Rajski, J. Tyszer, C. Wang, and S.M. Reddy, "Convolutional Compaction of Test Responses," Proc. IEEE Int'l. Conf. On Computer-Aided Design, pp. 745-754, 2003.
C. Wang, S. M. Reddy, I. Pomeranz, J. Rajski, and J. Tyszer, "On Compacting Test Response Data Containing Unknown Value," Proc. IEEE Int'l. Conf. On Computer-Aided Design, pp. 855-862, 2003.

* cited by examiner

*Primary Examiner*—Christine T Tu
(74) *Attorney, Agent, or Firm*—Bacon & Thomas, PLLC

(57) ABSTRACT

A method and apparatus for compacting test responses containing unknown values in a scan-based integrated circuit. The proposed X-driven compactor comprises a chain-switching matrix block and a space compaction logic block. The chain-switching matrix block switches the internal scan chain outputs before feeding them to the space compaction logic block for compaction so as to minimize X-induced masking and error masking. The X-driven compactor further selectively includes a finite-memory compaction logic block to further compact the outputs of the space compaction logic block.

12 Claims, 11 Drawing Sheets

COMPACTING TEST RESPONSES USING X-DRIVEN COMPACTOR

REFERENCE TO RELATED APPLICATIONS

This application claims the benefit of and priority of Provisional Application No. 60/844,390, filed Sep. 14, 2006 entitled COMPACTING TEST RESPONSES USING X-DRIVEN COMPACTOR.

FIELD OF THE INVENTION

The present invention generally relates to the field of scan-based design and test using design-for-test (DFT) techniques. Specifically, the present invention relates to the field of scan testing and test compression.

BACKGROUND

As integrated circuits increase in size and complexity, test compression is becoming a requirement for reducing test data volume and test application time. Test compression compresses the amount of both stimuli and response data that must be stored in an automatic test equipment (ATE).

Test stimulus compression is done by adding a decompressor at the scan input side of the scan chains for decompressing n-input compressed test patterns stored in the ATE to m-input decompressed test patterns for driving m internal scan chains during each scan shift cycle, where n<m. The decompressor can be a linear feedback shift register (LFSR) based finite-state machine or a combinational logic network using a multiplexer (MUX) network or exclusive-OR (XOR) network. When a combinational logic network is used, the decompressor is also referred to as a broadcaster.

Test response compaction is done by adding a compactor at the scan output side of the scan chains for compacting the m-output decompressed test response of the scan chains to an n-output compressed test response during each scan shift cycle, where n<m. The compactor can be a time compactor, a finite-memory compactor or a Space compactor. Both time compactor and finite-memory compactor are sequential circuits. Space compactors are often built out of XOR or Exclusive-NOR (XNOR) networks and do not contain storage elements. FIG. 1 shows a Space compactor using an XOR tree. Space compactor cone N is defined as the logics back-traceable, until a compactor input is reached, from compactor output index N. Scan chains to be compacted and observed via a specific Space compactor output N are referred to as driver chains for the Space compactor cone N. For example, in FIG. 1, the scan chains 110, 111, 112 and 113 are driver chains for the first Space compactor cone (distinguished by the first output SO1 120), scan chains 114, 115, 116, 117, 118 and 119 are driver chains for the second Space compactor cone (distinguished by the second output SO2 121). If values captured by scan cells are shifting into the same Space compactor cone at the same cycle, the scan cells are said to be "compacting in step". For example, if scan chain 114 has M scan cells, scan chain 115 has L scan cells and we use SC(A, B) to represent B-th scan cell of chain A, then SC(114, M) and SC(15, L), SC(114, M–1) and SC(115, L–1), SC(114, M–2) and SC(115, L–2), etc. are compacting in step.

In scan-based designs, a certain number of scan cells may capture unknown (X) values during capture cycle. Potential sources of X's can come from an uninitialized memory, black box, bus contention, non-scan latches and flip-flops, floating bus, multi-cycle paths, cross-clock-domain logic, etc. These X's are generally repaired at the design stage in order to increase the circuit's fault coverage. However, some X's, like races, may become known very late at the design or manufacturing stage, and thus cannot be repaired. Once captured by scan cells, these X values will be injected to the compactor during response compaction. Since a time compactor is LFSR-based with output feeding back to its inputs, once an X value is injected, the X will stay in the compactor and thus destroy its signature. Because a finite-memory compactor is usually shift-register-based, the X will stay only for a few clock cycles in the compactor before being flushed out. In the Space compactor's case, since it contains no storage elements and feedback paths, the X can be shifted out in one single clock cycle.

When using a Space compactor, if a scan cell with a captured fault effect is compacting in step with a scan cell with a captured X value, the fault effect might be masked by the X value during compaction and cannot be detected by the ATE. This problem is called X-induced masking. A scan cell capturing X value and is expected to cause a specific X-induced masking effect in the single-fault model is called the X-masking scan cell and scan cells capturing fault effects yet masked by the X-masking scan cell are called the victim scan cells. Note that a victim cell is always compacting in step with a X-masking scan cell in a Space compactor. A scan chain containing X-masking scan cell(s) is called the X-masking scan chain. If two or more scan cells with captured fault effects are compacting in step but eventually the fault effects cancel each other out during compaction, the problem is called Error masking (Aliasing). Scan cells causing a specific Aliasing effect in the single-fault model are called the Aliasing scan cells and scan chains containing Aliasing scan cells are called the Aliasing scan chains. Aliasing scan cells are always compacting in step in a Space compactor. The circuit's fault coverage might decrease due to X-induced masking and Error masking when a compactor is used.

Since X values may mask fault effects, various compactors have been developed in the literature to reduce X impact. For example, the X-compact, which is one type of X tolerant compactor, proposed by Mitra et al. (2004) generally comprises internal scan chain outputs connected to more than one XOR gate in an XOR tree. This compactor, however, cannot tolerate circuits with many X values appearing at the scan channels. The selective compactor described in the U.S. patent application Ser. No. 10/973,522 by Rajski et al. (2004) can selectively mask X's on scan chains to avoid X-induced masking by using selective registers. However, this compactor needs additional registers (storage elements) and decoding logic to block X-value propagation.

A scalable compactor described by Wohl et al. (2004) is shown in FIG. 2. This prior art solution uses pure multiplexer (MUX) networks as scan output selectors with full X-tolerant and scan-based diagnosis ability. It relies on selective observation of scan chain outputs without using an XOR tree to compact the response data. However, it needs many additional input pins to select scan chain outputs. It also reduces the ATPG dynamical compaction ability because only a small fraction of scan outputs can be used for observation.

Convolutional compactor and block compactor were described in the U.S. patent application Ser. No. 10/778,950 by Rajski, et al. (2004) and the paper by Wang, et al. (2003), respectively. These prior art solutions proposed finite memory compactors to generate a signature of response data in several scan cycles. FIG. 3 is a finite memory compactor comprising an injector network (using XOR gates), storage elements, and an optional switch network. The compactor has limited X tolerant ability since X-values that are fed into the compactor can be clocked out after a finite clock cycles.

Therefore, there is a need to improve upon the current Space compactor with high compaction capability and without heavy area overhead to solve the X-induced masking and error masking problems. In addition, this solution should further allow provision to perform scan debug, diagnosis and yield improvement of the DFT methodologies utilizing embedded scan chains possibly without impacting the speed at which the scan operation is performed.

SUMMARY OF INVENTION

The objective of the present invention is to provide an improved X mask-free Space compactor, named X-driven compactor, which advantageously minimizes X-induced masking and error masking. The X-driven compactor has the ability to switch scan chains to become driver chains for specific Space compactor cones. With the switching capability, a fault effect expected to be masked by the X-masking scan cell—has a better chance propagating to X-driven compactor outputs for observation by switching the relevant X-masking scan chain to become the driver chain for a Space compactor cone not assigned (off-duty) to observe the fault effects. Similarly, if error masking is expected to occur in the Space compactor, switching one or more of the Aliasing scan chains to be driver chains for another off-duty Space compactor cone can also minimize error masking. The aforementioned switching mechanism that minimizes X-masking and/or Alising is herein categorizingly named "X-driven switching". Dynamic X-driven switching by switching X-masking and/or Aliasing scan chains to become driver chains for off-duty Space compactor cones at relevant shift cycles can dramatically minimize X-induced masking and Aliasing, thus allowing fault effects to be observed and fault coverage increases accordingly.

The present invention advantageously can be realized with one space compaction logic block (SCLB) and one chain-switching matrix block (CSMB). The SCLB can be an XOR tree, XOR Inject Network, X-compact and any other Space compactor. The CSMB comprises primitive gates such as MUX, AND, OR, NAND, NOR, BUF, INV gates or switching components (e.g., Crossbar or modular switches). The CSMB selectively switches the internal scan chain outputs and feeds them into the SCLB.

The foregoing and additional objects, features and advantages of the invention will become more apparent from the following detailed description, which proceeds with references to the following drawings.

THE BRIEF DESCRIPTION OF DRAWINGS

Figure 6:
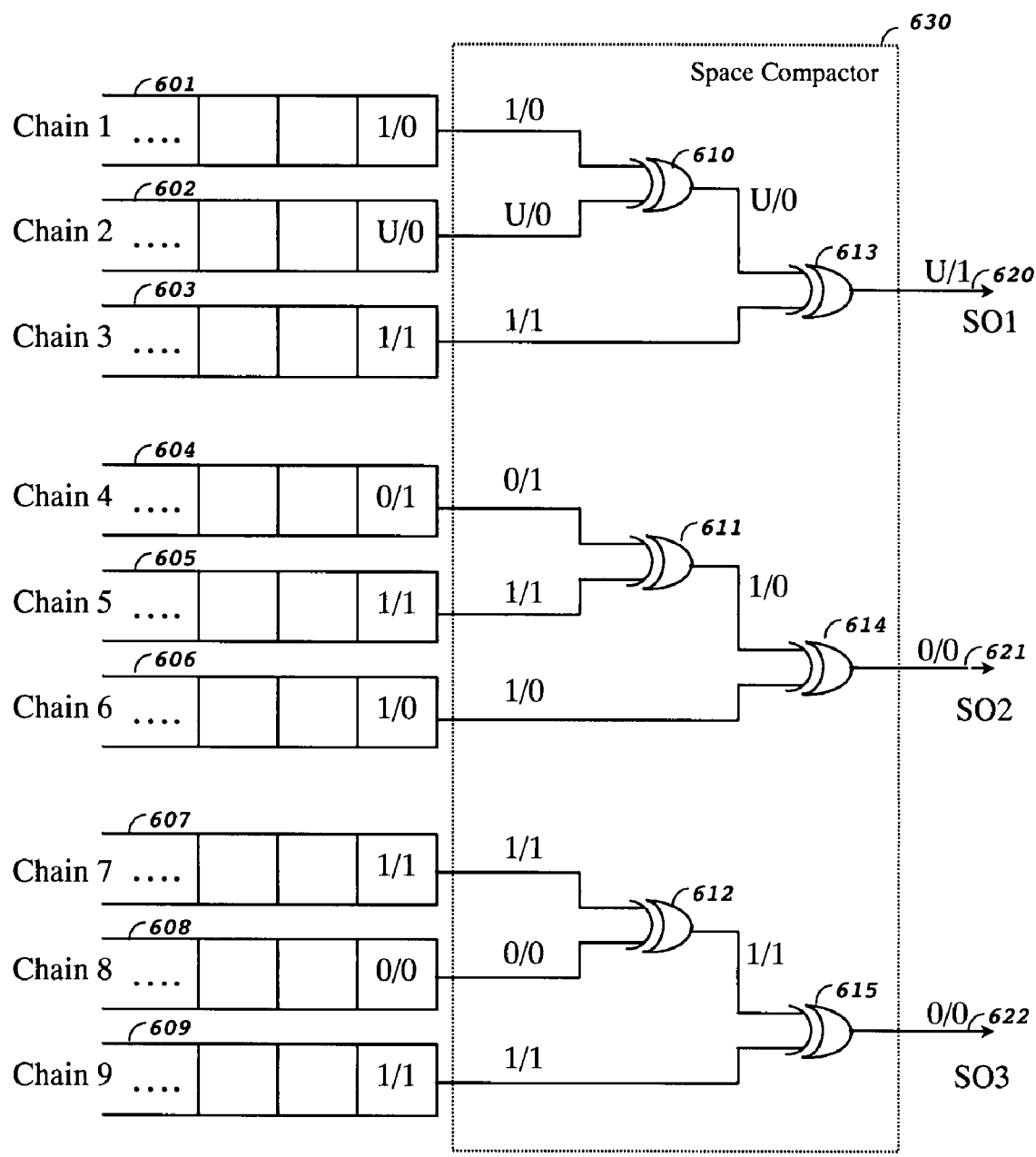
Figure 7:
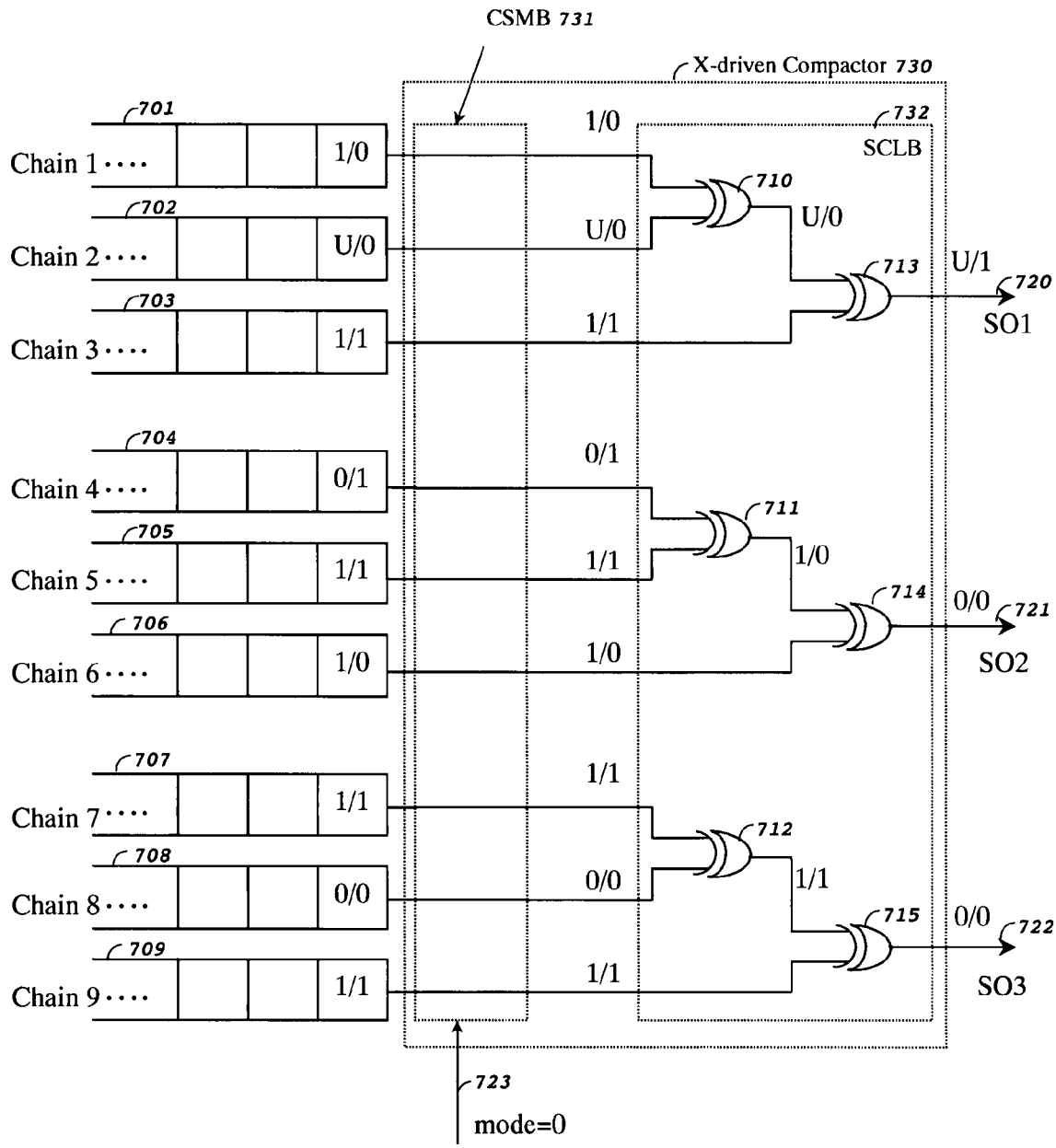
Figure 8:
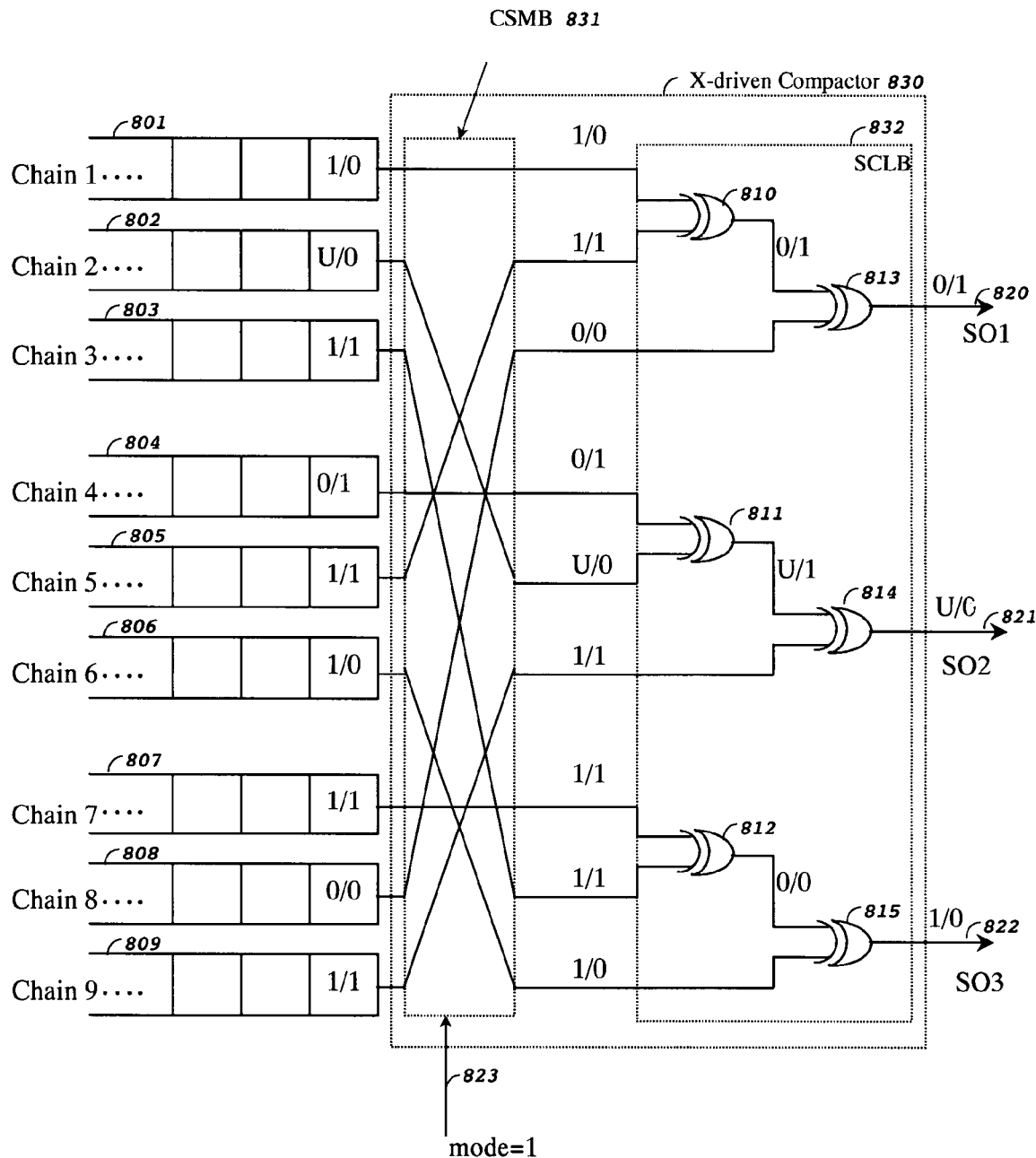
Figure 9:
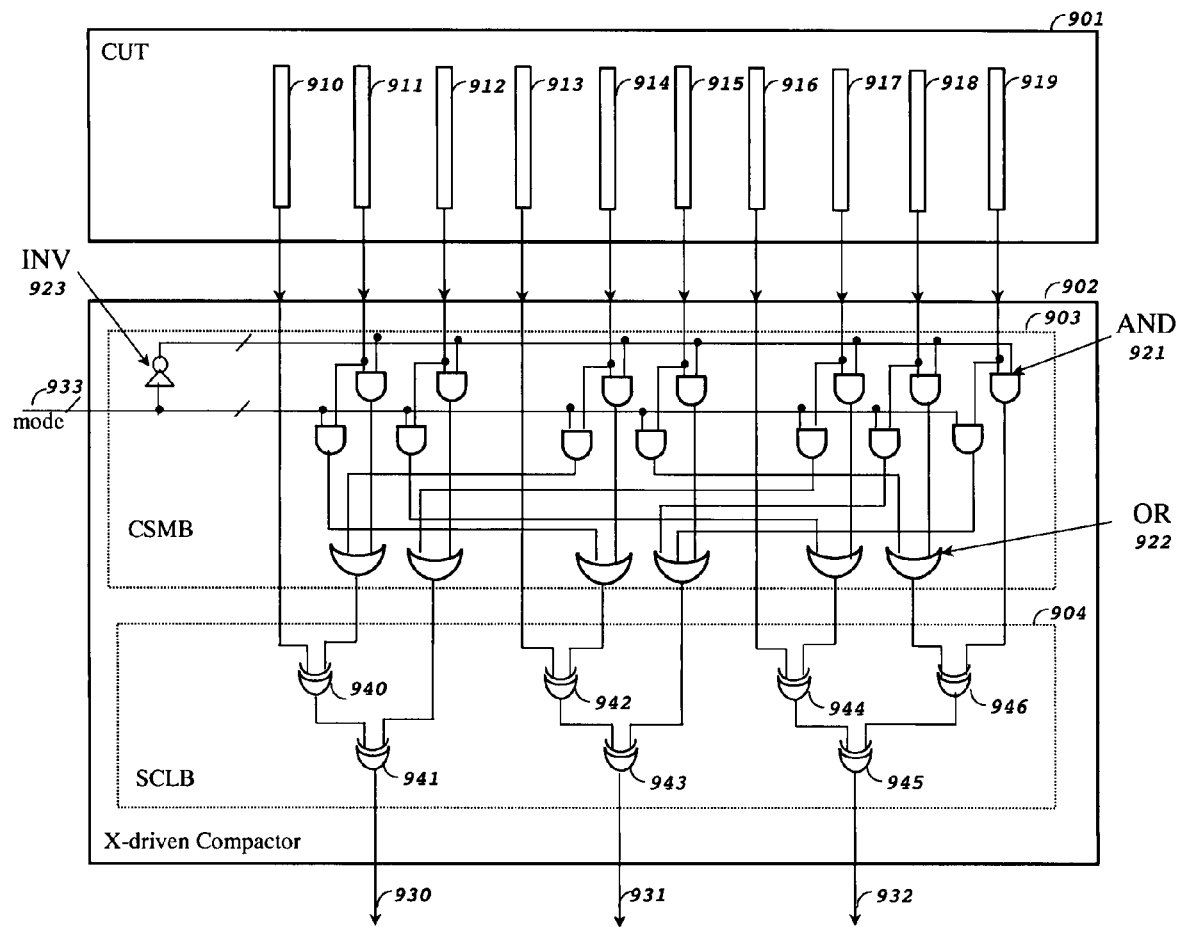
Figure 10:
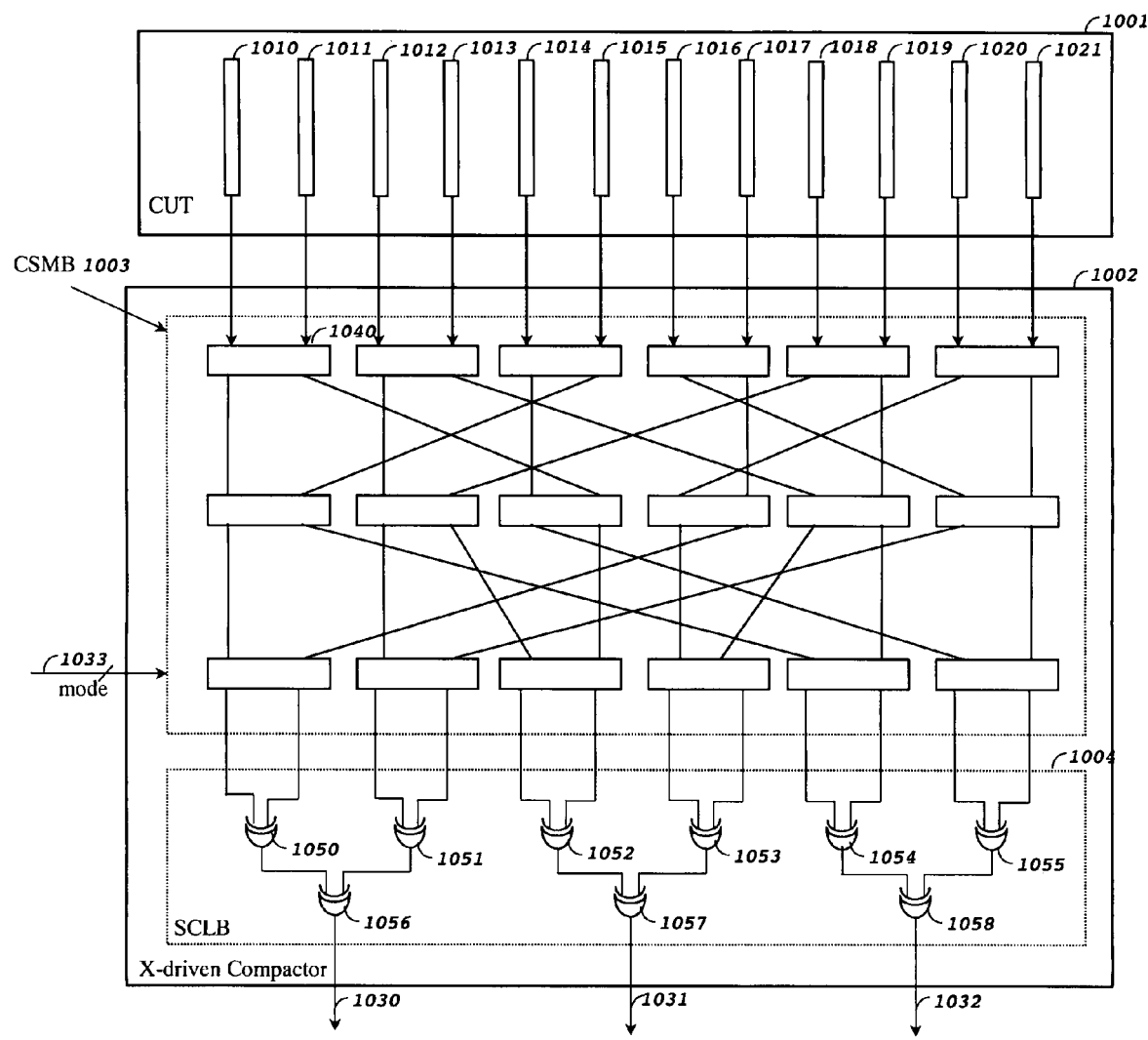
Figure 11:
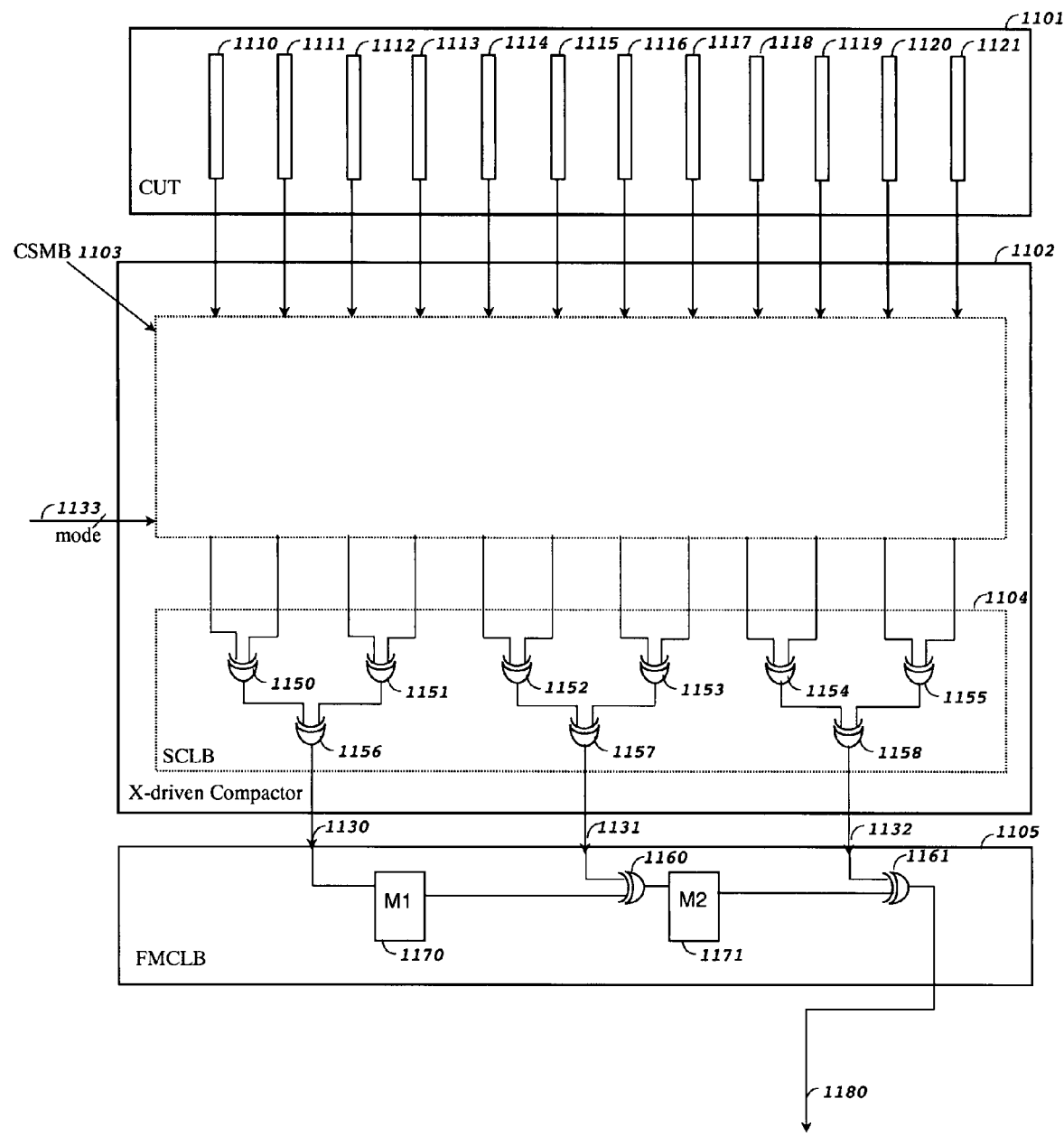

FIG. 6, FIG. 7, and FIG. 8 illustrate how the X-driven compactor switches output scan chains to avoid X-induced masking and error masking;

FIG. 9 is a schematic depiction of another embodiment of the present invention; and FIG. 10 and FIG. 11 are schematic depictions of yet other embodiments of the present invention.

DETAILED DESCRIPTION OF THE INVENTION

The following description is presently contemplated as the best mode of carrying out the present invention. This description is not to be taken in a limiting sense but is made merely for the purpose of describing the principles of the invention. The scope of the invention should be determined by referring to the appended claims.

Figure 1:
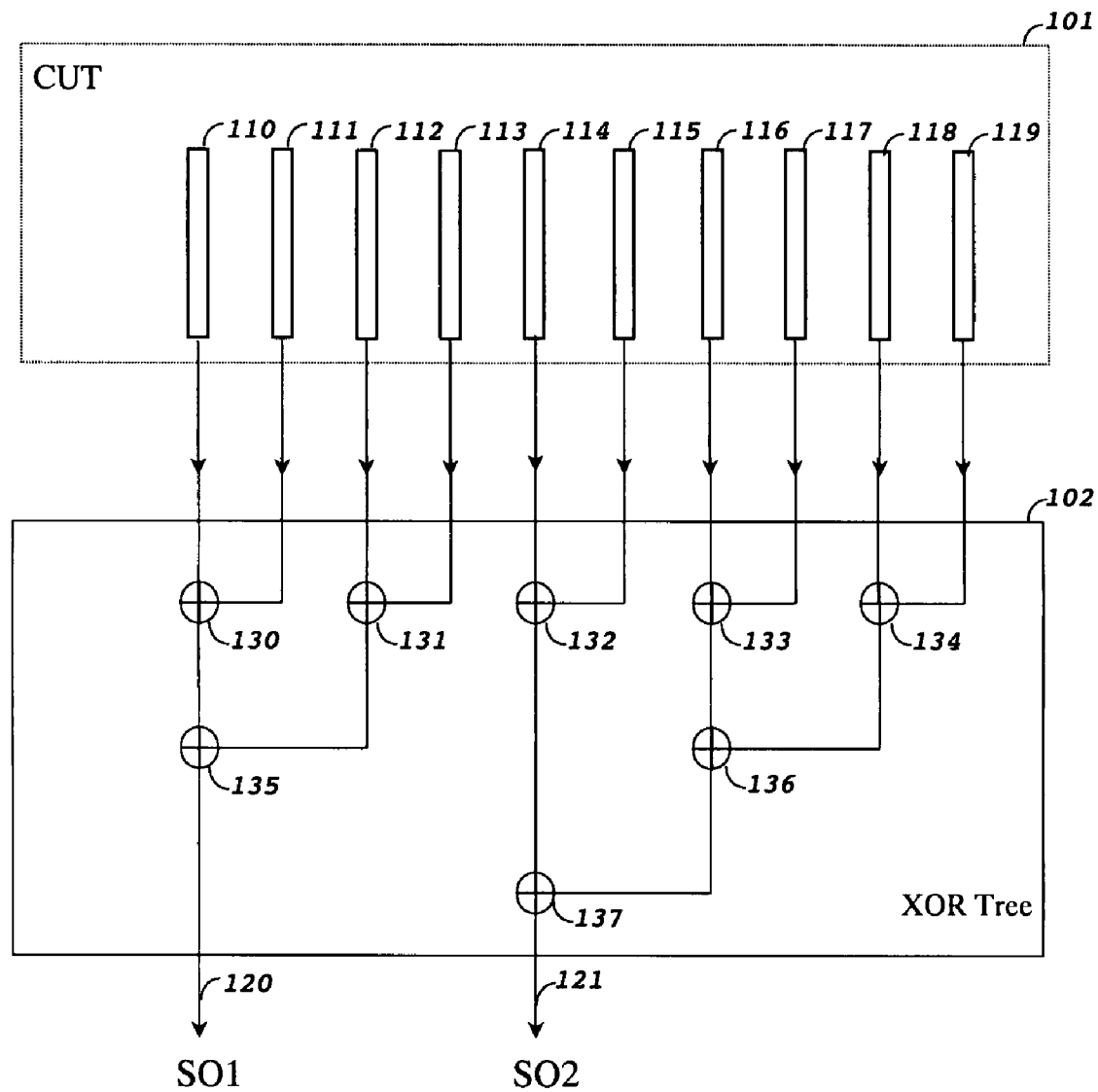
FIG. 1 is a circuit diagram of a prior art system using Space compactor built with an exclusive-OR (XOR) tree.

FIG. 1 shows a circuit diagram of a prior art system that includes multiple scan chains 110-119 in a circuit-under-test (CUT) 101 and a Space compactor built with an Exclusive-OR (XOR) tree. The outputs of multiple scan chains 110-119 feed to a Space compactor 102 built with XOR gates 130-137. The results from the Space compactor become compressed test responses SO1-SO2 120-121, which are then compared with expected test responses to determine the pass/fail status of the CUT 101.

Figure 2:
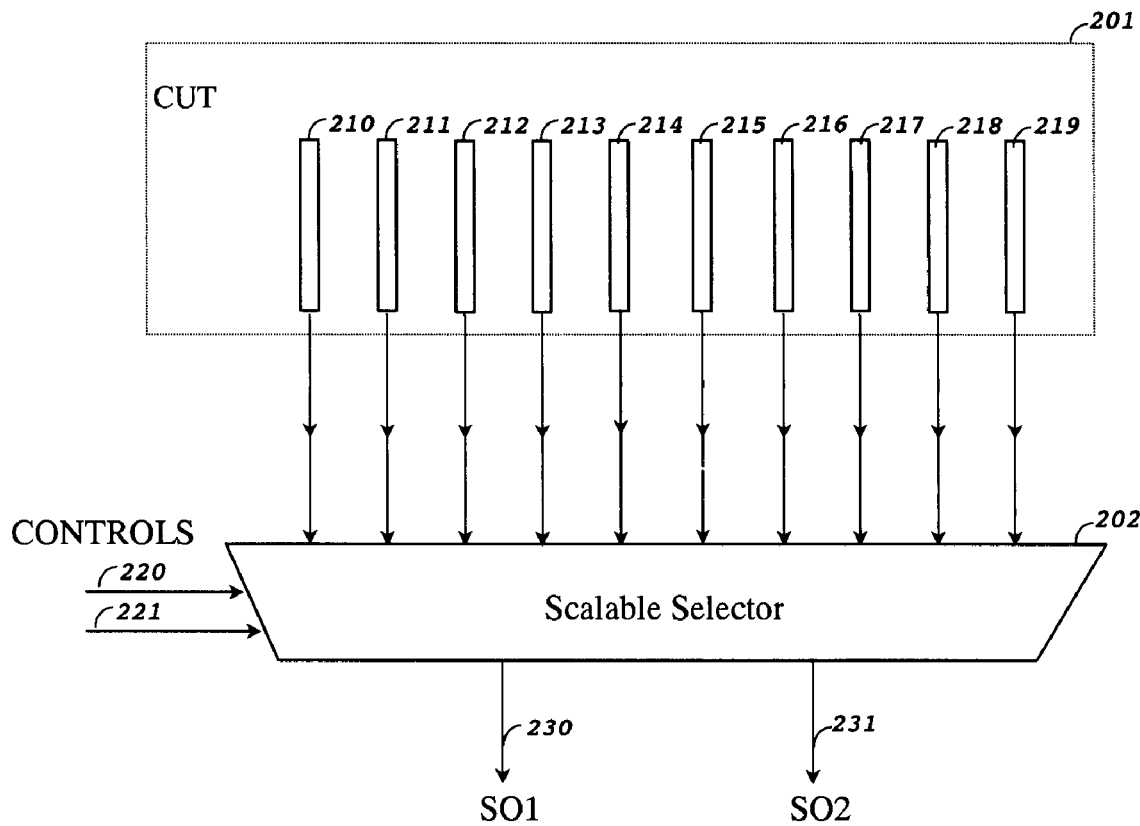
FIG. 2 is a circuit diagram of a prior art system using Space compactor built with a scalable selector.

FIG. 2 shows a circuit diagram of a prior art system that includes multiple scan chains 210-219 in a circuit-under-test (CUT) 201 and a Space compactor built with a scalable selector 202. The scalable selector 202 comprises a MUX network and control logic. The outputs of multiple scan chains 210-219 feed to the scalable selector 202 with select signals CONTROLS 220-221. The results from the Space compactor become compressed test responses SO1-SO2 230-231, which are then compared with expected test responses to determine the pass/fail status of the CUT 201.

Figure 3:
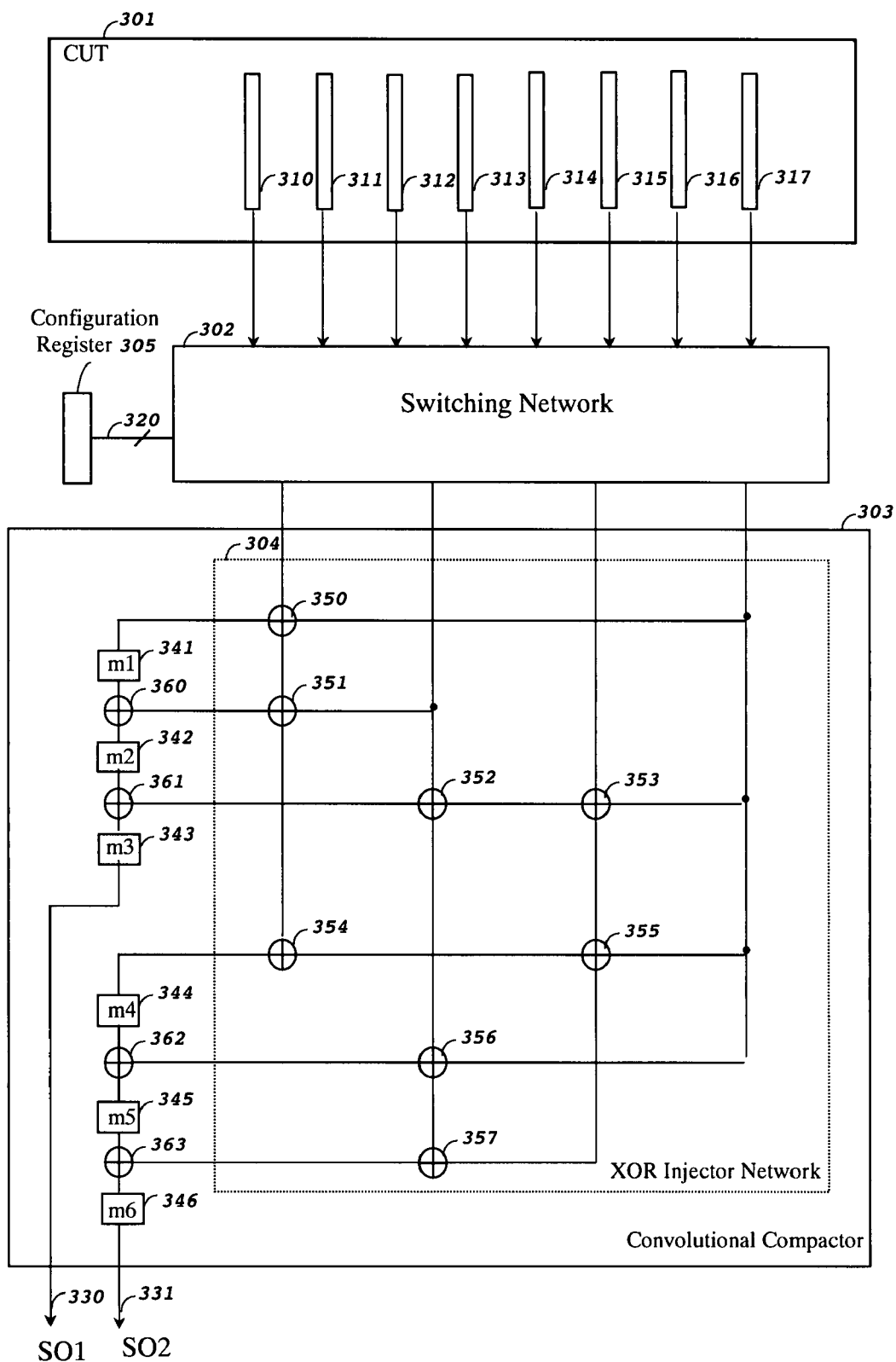
FIG. 3 is a circuit diagram of a prior art system using finite memory compactor with a programmable switch network.

FIG. 3 shows a circuit diagram of a prior art system that includes multiple scan chains 310-317 in a circuit-under-test (CUT) 301 and a convolutional compactor 303 which is a finite memory compactor. The outputs of multiple scan chains 310-317 feed to the convolutional compactor 303 through a switch network 302. The convolutional compactor 303 comprises an injector network 304 and storage elements (m1-m6) 341-346. The injector network 304 comprises XOR gates 350-357. The switch network 302 selectively configures the interconnection between the scan chain outputs and inputs to the convolutional compactor 303. The switch network 302 is controlled by a configuration register 305. The results from the convolutional compactor become compressed test responses SO1-SO2 330-331, which are then compared with expected test responses to determine the pass/fail status of the CUT 301.

Figure 4:
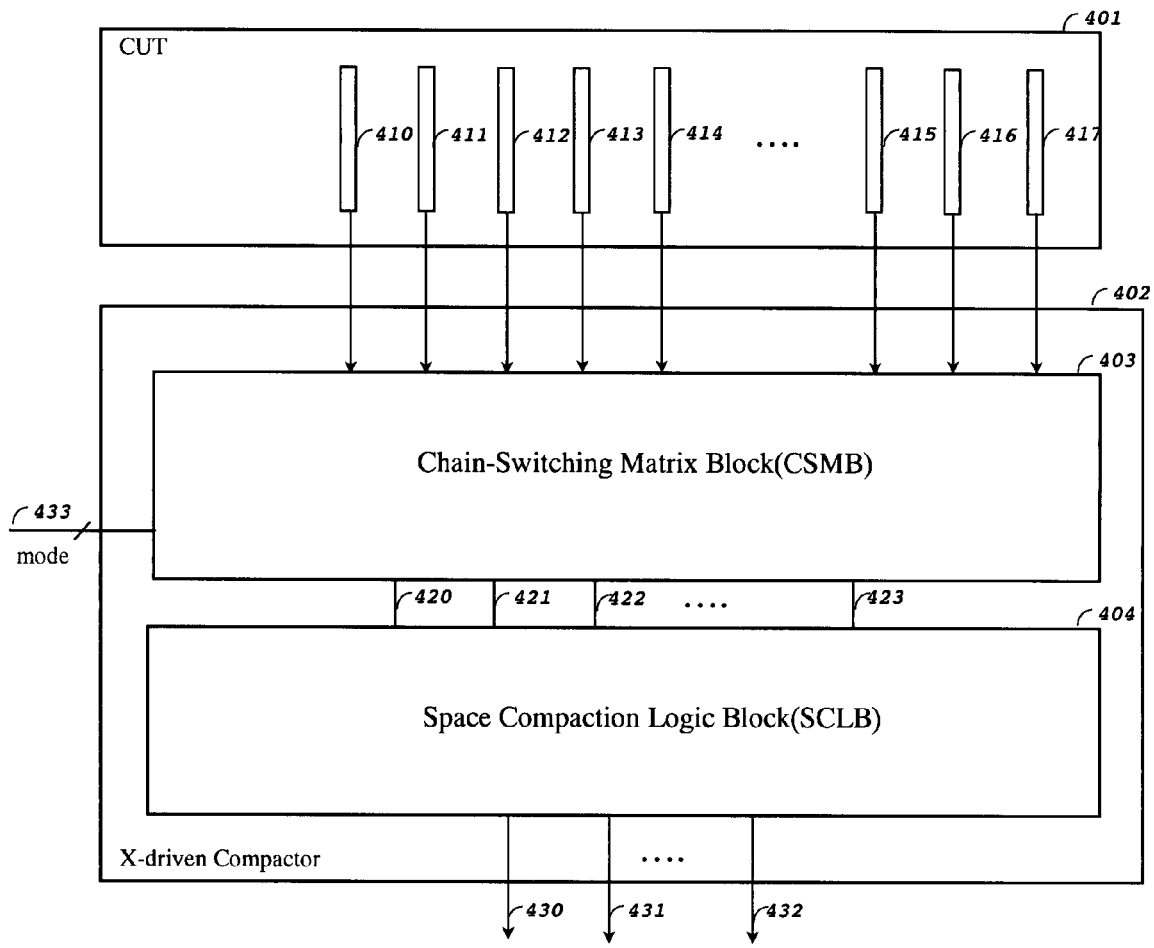
FIG. 4 shows a block diagram of a system using the X-driven compactor in accordance with the present invention.

FIG. 4 shows a block diagram of a system using the X-driven compactor in accordance with the present invention. It includes multiple scan chains 410-417 in a circuit-under-test (CUT) 401 and an X-driven compactor 402. The X-driven compactor 402 comprises a chain-switching matrix block (CSMB) 403 and a space compaction logic block (SCLB) 404. The CSMB 403 comprises primitive gates such as MUX, AND, OR, NAND, NOR, BUF, INV gates or switching components (e.g., crossbar or modular switches). The SCLB 404 can be an XOR tree, an XOR injector network, an X-tolerant compactor, or any other Space compactor. The CSMB 403 selects the M internal scan chains 410-417 with N outputs 420-423 feeding into SCLB 404, where M, N could be equal or unequal. The results from the X-driven compactor become the compressed test responses 430-432, which are then compared with expected test responses to determine the pass/fail status of the CUT 401. The selection signals mode 433 of the X-driven compactor may dynamically switch scan chain outputs to connect to relevant SCLB 404 inputs at each shift cycle to minimize the X-induced masking and/or Aliasing or keep constant in the whole shift sequence.

Figure 5:
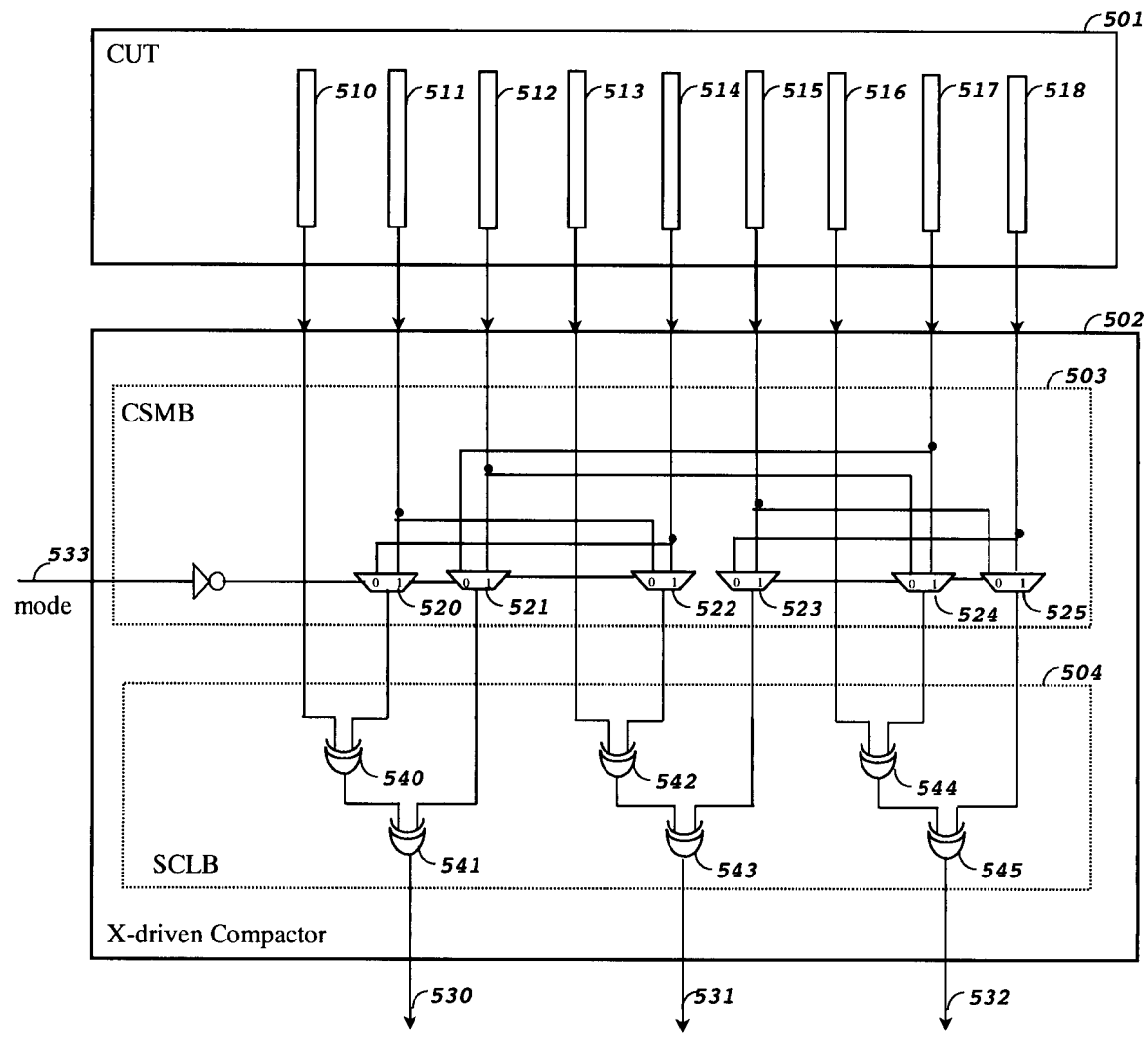
FIG. 5 shows a circuit diagram of a system with one embodiment of the X-driven compactor in accordance with the present invention.

FIG. 5 shows a circuit diagram of a system with one embodiment of the X-driven compactor in accordance with the present invention. It comprises multiple scan chains 510-518 in a circuit-under-test (CUT) 501 and an X-driven compactor 502. The X-driven compactor 502 comprises CSMB 503 built with a MUX network and SCLB 504 built with an XOR tree.

It is noted that, although a switching box with fully configurable N-input-to-N-output unique mapping can efficiently minimize X-induced masking and Aliasing, the cost of implementing such a switch might be prohibiting. Thus there is a need to design a switch box with limited switching capability yet achieves similar or acceptable result of reducing of X-induced masking and/or Aliasing nonetheless. In this embodiment, referring to FIG. 5, the SCLB 504 is an XOR-tree Space compactor whose input-output path relationship can be represented by a 9×3 compactor matrix, M. The row number of the compactor matrix corresponds to the index of SCLB input that is connected to an internal scan chain output and the column number corresponds to the index of Space compactor outputs. An '1' in the R-th row and C-th column matrix entry M(R, C) means the scan chain with scan output connecting to the R-th SCLB input is the driver chain for the C-th Space compactor cone. For example, $$M = \begin{bmatrix} 1 & 0 & 0 \\ 1 & 0 & 0 \\ 1 & 0 & 0 \\ 0 & 1 & 0 \\ 0 & 1 & 0 \\ 0 & 1 & 0 \\ 0 & 0 & 1 \\ 0 & 0 & 1 \\ 0 & 0 & 1 \end{bmatrix}$$

means the internal scan chains with scan outputs connecting to the first, second and third SCLB inputs are the driver chains for the first Space compactor cone, the internal scan chains with scan outputs connecting to the fourth, fifth and sixth SCLB inputs are the driver chains for the second Space compactor cone and, the internal scan chains with scan outputs connecting to the seventh, eighth and ninth SCLB inputs are the driver chains for the third Space compactor cone.

The CSMB 503 comprises MUX elements and a selection signal mode 533. The results from the X-driven compactor become compressed test responses 530-532, which are then compared with expected test responses to determine the pass/fail status of the CUT 501. When mode=0, the X-driven compactor is the same as the XOR tree shown in FIG. 1. When it was determined by the ATPG program that the X-induced masking is to occur, mode is changed to 1 and the CSMB will be configured to switch the X-masking scan chain to become a driver chain for an off-duty Space compactor cone. The solution to designing CSMB for different modes can be achieved through matrix manipulations.

The design of CSMB 503 at mode=1 is to (1) keep one original scan chain, say S, as the driver chain for, say, Space compactor cone N, the original Space compactor cone for which S was a driver chain, (2) All other original driver chains for the Space compactor cone N are switched to become driver chains for other Space compactor cones, following the rule that any two of the original driver chains for Space compactor cone N are not to be switched to become driver chains for the same Space compactor cone. The rationale behind the design is that, (1) X-induce masking and/or Aliasing can be avoided under the single X an/or Aliasing situation. (2) For the multiple X's and/or Aliasing situation, the possibility of X-induced masking and/or Aliasing would be reduced, sometime significantly. The CSMB's design via matrix manipulations comprises the following: Step (1) First generating an identity matrix for a default selection signal mode (mode=0), where elements along the diagonal are set to '1' and other elements are set to '0' to form an identify matrix; Step (2) Reorder the rows of the identity matrix to maximize the distribution of 1's corresponding to different Space compactor cones for additional selection signal modes; Step (3) The final switching matrix is the sum of the matrices derived under all possible mode conditions.

Referring to FIG. 5, the CSMB 503 comprises MUX elements and selection signal mode 533. CSMB's matrix T, where the number of rows and columns are the same as the number of internal scan chains, is a representation of the routing of incoming signals (internal scan chain outputs) with respect to outgoing signals (SCLB inputs). A '1' at the R-th row and C-th column matrix entry T(R, C) denotes that the R-th CSMB input (the R-th internal chain output) is switched to the C-th CSMB output (the C-th SCLB input). Referring to FIG. 5 for Step (1), there are 9 internal scan chains 510-518 and 3 external chain outputs 530-532. The default (mode=0) is a 9×9 identity matrix $T_{mode=0}$ where an incoming signal and an outgoing signal are the same:

$$T_{mode=0} = \left[\begin{array}{cccc|cccc|cc} 1 & 0 & 0 & 0 & 0 & 0 & 0 & 0 & 0 \\ 0 & 1 & 0 & 0 & 0 & 0 & 0 & 0 & 0 \\ 0 & 0 & 1 & 0 & 0 & 0 & 0 & 0 & 0 \\ \hline 0 & 0 & 0 & 1 & 0 & 0 & 0 & 0 & 0 \\ 0 & 0 & 0 & 0 & 1 & 0 & 0 & 0 & 0 \\ 0 & 0 & 0 & 0 & 0 & 1 & 0 & 0 & 0 \\ \hline 0 & 0 & 0 & 0 & 0 & 0 & 1 & 0 & 0 \\ 0 & 0 & 0 & 0 & 0 & 0 & 0 & 1 & 0 \\ 0 & 0 & 0 & 0 & 0 & 0 & 0 & 0 & 1 \end{array}\right]$$

Referring to FIG. 5 for Step (2), CSMB 503 comprises MUX elements and selection signal mode 533, and is depicted as a 9×9 matrix $T_{mode=1}$, when mode=1.

$$T_{mode=1} = \left[\begin{array}{cccc|cccc|cc} 1 & 0 & 0 & 0 & 0 & 0 & 0 & 0 & 0 \\ 0 & 0 & 0 & 0 & 1 & 0 & 0 & 0 & 0 \\ 0 & 0 & 0 & 0 & 0 & 0 & 0 & 1 & 0 \\ \hline 0 & 0 & 0 & 1 & 0 & 0 & 0 & 0 & 0 \\ 0 & 1 & 0 & 0 & 0 & 0 & 0 & 0 & 0 \\ 0 & 0 & 0 & 0 & 0 & 0 & 0 & 0 & 1 \\ \hline 0 & 0 & 0 & 0 & 0 & 0 & 1 & 0 & 0 \\ 0 & 0 & 1 & 0 & 0 & 0 & 0 & 0 & 0 \\ 0 & 0 & 0 & 0 & 0 & 1 & 0 & 0 & 0 \end{array}\right]$$

A basic matrix design rule in Step (2) is to reorder the rows of the default identity matrix T to maximize the distribution of 1's to different quadrants of the matrix, mimicking the way switching driver chains to Space compactor cones under mode=1.

Referring to FIG. 5 for Step (3), the matrix of CSMB 503 under mode=u is depicted as matrix $T=(\bar{u}T_{mode=0}+uT_{mode=1})$, u can be 0 or 1 and $\bar{u}$ is 2's compliment of u.

$$T = \begin{bmatrix} 1 & 0 & 0 & 0 & 0 & 0 & 0 & 0 & 0 \\ 0 & \overline{u} & 0 & 0 & u & 0 & 0 & 0 & 0 \\ 0 & 0 & \overline{u} & 0 & 0 & 0 & 0 & u & 0 \\ 0 & 0 & 0 & 1 & 0 & 0 & 0 & 0 & 0 \\ 0 & u & 0 & 0 & \overline{u} & 0 & 0 & 0 & 0 \\ 0 & 0 & 0 & 0 & 0 & \overline{u} & 0 & 0 & u \\ 0 & 0 & 0 & 0 & 0 & 0 & 1 & 0 & 0 \\ 0 & 0 & u & 0 & 0 & 0 & 0 & \overline{u} & 0 \\ 0 & 0 & 0 & 0 & 0 & u & 0 & 0 & \overline{u} \end{bmatrix}$$

The resulting matrix for input-output relationship of X-driven compactor 502 is depicted as matrix N=T·M. Where a '1' at the R-th row and C-th column matrix entry N(R,C) denotes that the R-th internal chain is the driver chain for the C-th Space compactor cone.

$$N = \begin{bmatrix} 1 & 0 & 0 & 0 & 0 & 0 & 0 & 0 & 0 \\ 0 & \overline{u} & 0 & 0 & u & 0 & 0 & 0 & 0 \\ 0 & 0 & \overline{u} & 0 & 0 & 0 & 0 & u & 0 \\ 0 & 0 & 0 & 1 & 0 & 0 & 0 & 0 & 0 \\ 0 & u & 0 & 0 & \overline{u} & 0 & 0 & 0 & 0 \\ 0 & 0 & 0 & 0 & 0 & \overline{u} & 0 & 0 & u \\ 0 & 0 & 0 & 0 & 0 & 0 & 1 & 0 & 0 \\ 0 & 0 & u & 0 & 0 & 0 & 0 & \overline{u} & 0 \\ 0 & 0 & 0 & 0 & 0 & u & 0 & 0 & \overline{u} \end{bmatrix} \cdot \begin{bmatrix} 1 & 0 & 0 \\ 1 & 0 & 0 \\ 1 & 0 & 0 \\ 0 & 1 & 0 \\ 0 & 1 & 0 \\ 0 & 1 & 0 \\ 0 & 0 & 1 \\ 0 & 0 & 1 \\ 0 & 0 & 1 \end{bmatrix} = \begin{bmatrix} 1 & 0 & 0 \\ \overline{u} & u & 0 \\ \overline{u} & 0 & u \\ 0 & 1 & 0 \\ u & \overline{u} & 0 \\ 0 & \overline{u} & u \\ 0 & 0 & 1 \\ u & 0 & \overline{u} \\ 0 & u & \overline{u} \end{bmatrix}$$

FIG. 6 shows the X-induced masking and error masking issues in a circuit with a Space compactor 630 built with simple exclusive-OR (XOR) gates 610-615 that compact internal scan chains (Chain 1-9) 601-609 to external scan outputs (SO1-SO3) 620-622. In the shift cycle of interest, Chain 1 has fault effect 1/0 (Good/Bad value), Chain 2 has X value with fault effect U/0 (where U represents Unknown), Chain 4 has fault effect 0/1, and Chain 6 has fault effect 1/0. However, after compaction, the values of SO1-SO3 are {U, 0, 0} in the good circuit and {1, 0, 0} in the faulty circuit. This means that no fault effect is observed at SO1-SO3, since they are either due to X-induced masking, aliasing, or simply because no fault effect exists due to circuit characteristics.

FIG. 7 and FIG. 8 illustrate the principles of using one embodiment of the X-driven compactor as shown in FIG. 5 to compact the scan chain responses. FIG. 7 shows the results when the selection signal mode 723 is set to 0, mode=0. The X-driven compactor 730 compacts the output values—of the nine internal scan chains (Chain 1-9) 701-709 and to form three external scan outputs (SO1-SO3) 720-722. The X-driven compactor 730 comprises CSMB 731 and SCLB 732. The SCLB is an XOR tree the same as shown in FIG. 6. When the selection signal mode 723 is set to 0, the circuit behaves exactly the same as in FIG. 6, meaning no fault effect is observed at SO1-SO3 because they are either due to X-induced masking, aliasing, or simply because no fault effect exists due to circuit characteristics.

FIG. 8 shows the results when the selection signal mode 823 is set to 1, mode=1. The X-driven compactor 830 compacts internal scan chains (Chain 1-9) 801-809 to external scan outputs (SO1-SO3) 820-822. The X-driven compactor 830 comprises CSMB 831 and SCLB 832 using the same XOR tree as in FIG. 6. As the result of CSMB's, 831's, matrix operation when mode 823 is set to 1, Chain 1 has fault effect 1/0, Chain 2 has X value U/0, Chain 4 has fault effect 0/1, and Chain 6 has fault effect 1/0 in current shift clock cycle. When the selection signal mode 823 equals 1, the X value is propagated to SO2 821 that bears no duty of observing the fault effects. One of the fault effects is propagated to SO3 822 to avoid aliasing. After compaction, the SO-SO3 values are {0, U, 1} in the good circuit and {1, 0, 0} in the faulty circuit. The faults are now detected at SO1 and SO3 without X-induced masking and aliasing.

FIG. 9 shows a circuit diagram of a system with another embodiment of the X-driven compactor in accordance with the present invention. It comprises multiple scan chains 910-919 in a circuit-under-test (CUT) 901 and an X-driven compactor 902. The X-driven compactor 902 comprises CSMB 903 and SCLB 904 built with a Space compactor (an XOR tree). The CSMB 903 comprises AND 921, OR 922, INV 923 gates and selection signals mode 933. Here, the mode 933 is comprised of two pins from primary inputs to switch scan chain output connections. The results from the Space compactor become compressed test responses 930-932, which are then compared with expected test responses to determine the pass/fail status of the CUT 901.

Referring to FIG. 9, an XOR tree 904 as the SCLB is depicted as a 10×3 matrix, M'

$$M' = \begin{bmatrix} 1 & 0 & 0 \\ 1 & 0 & 0 \\ 1 & 0 & 0 \\ 0 & 1 & 0 \\ 0 & 1 & 0 \\ 0 & 1 & 0 \\ 0 & 0 & 1 \\ 0 & 0 & 1 \\ 0 & 0 & 1 \\ 0 & 0 & 1 \end{bmatrix}$$

Referring to FIG. 9, according to the optimal matrix design rule, the X-driven compactor 902 is depicted as matrix N', here mode={$u_1$, $u_2$}.

$$N' = \begin{bmatrix} 1 & 0 & 0 & 0 & 0 & 0 & 0 & 0 & 0 \\ 0 & \overline{u}_1 & 0 & u_1 & 0 & 0 & 0 & 0 & 0 \\ 0 & 0 & \overline{u}_1 & 0 & 0 & 0 & u_1 & 0 & 0 \\ 0 & 0 & 0 & 1 & 0 & 0 & 0 & 0 & 0 \\ 0 & u_1 & 0 & 0 & \overline{u}_1 & 0 & 0 & 0 & 0 \\ 0 & 0 & 0 & 0 & 0 & \overline{u}_1 & 0 & u_1 & 0 \\ 0 & 0 & 0 & 0 & 0 & 1 & 0 & 0 & 0 \\ 0 & 0 & u_1 & 0 & 0 & 0 & \overline{u}_1 & 0 & 0 \\ 0 & 0 & 0 & 0 & u_1 & 0 & 0 & \overline{u}_1 & 0 \\ 0 & 0 & 0 & 0 & u_2 & 0 & 0 & 0 & \overline{u}_2 \end{bmatrix} \cdot \begin{bmatrix} 1 & 0 & 0 \\ 1 & 0 & 0 \\ 1 & 0 & 0 \\ 0 & 1 & 0 \\ 0 & 1 & 0 \\ 0 & 1 & 0 \\ 0 & 0 & 1 \\ 0 & 0 & 1 \\ 0 & 0 & 1 \\ 0 & 0 & 1 \end{bmatrix} = \begin{bmatrix} 1 & 0 & 0 \\ \overline{u}_1 & u_1 & 0 \\ \overline{u}_1 & 0 & u_1 \\ 0 & 1 & 0 \\ u_1 & \overline{u}_1 & 0 \\ 0 & \overline{u}_1 & u_1 \\ 0 & 0 & 1 \\ u_1 & 0 & \overline{u}_1 \\ 0 & u_1 & \overline{u}_1 \\ 0 & u_2 & \overline{u}_2 \end{bmatrix}$$

FIG. 10 shows a circuit diagram of a system with yet another embodiment of the X-driven compactor in accordance with the present invention. It comprises multiple scan chains 1010-1021 in a circuit-under-test (CUT) 1001 and an X-driven compactor 1002. The X-driven compactor 1002 comprises CSMB 1003 and SCLB block built with an XOR tree 1004. The CSMB 1003 comprises 2×2 modular switches 1040 and selection signal mode 1033. The results from the Space compactor become compressed test responses 1030-1032, which are then compared with expected test responses to determine the pass/fail status of the CUT 1001.

FIG. 11 shows a circuit diagram of a system with yet another embodiment to combine an X-driven compactor with a finite memory compaction to further compact-test responses in accordance with the present invention. It comprises multiple scan chains 1110-1121 in a circuit-under-test (CUT) 1101, an X-driven compactor 1102, and a finite-memory compaction logic block (FMCLB) 1105. The X-driven compactor 1102 comprises a CSMB 1103 and an SCLB block built with an XOR tree 1104. The CSMB 1103 is the same as CSMB 903 or CSMB 1003. The results from the X-driven compactor 1130-1132 become the inputs of FMCLB 1105. The FMCLB 1105 comprises XOR 1160-1161 gates and storage elements (M1-M2) 1170-1171. The storage element can be a flip-flop or latch. The results from the FMCLB 1105 become compressed test responses 1180, which are then compared with expected test responses to determine the pass/fail status of the CUT 1101.

In accordance with some embodiments of the invention, internal scan chain outputs may have multiple paths switching to SCLB and finally to different external scan outputs according to the selection signals. The selection signals may dynamically switch scan chain outputs in relevant shift cycles or conduct no switching in the whole shift operation. The selection signals can be selectively provided (1) directly from one or more primary inputs or (2) indirectly from the outputs of a combinational or sequential circuit coupled to scan channels of an ATE.

Generally, the X-driven compactor compacts the data from M internal scan chains to N scan chain outputs. If M is less than or equal to $N^2$ and each scan chain output compacts less than or equal to N internal scan chains, CSMB needs one selection signal to build the optimal CSMB matrix. Otherwise, additional selection signals may be necessary.

The control values for selection signals can be determined algorithmically during ATPG or using independent tools after ATPG to minimize or eliminate X-induced masking and error masking. Additional tools may be needed to perform pattern reordering when it is required to add or delete patterns.

Having thus described and illustrated specific embodiments of the present invention, it is to be understood that the objectives of the invention have been fully achieved. And it will be understood by those skilled in the art that many changes in construction and circuitry, and widely differing embodiments and applications of the invention will suggest themselves without departing from the spirit and scope of the present invention. The disclosures and the description herein are intended to be illustrative and are not in any sense limitation of the invention, more preferably defined in scope by the following claims.

What is claimed is:

1. An apparatus using a compactor driven by unknown (X) values for compacting test responses at the scan chain outputs of N internal scan chains in a scan-based integrated circuit to generate compacted test responses at M external scan outputs, where N>M, said apparatus comprising:
   (a) a chain-switching matrix block for receiving said test responses on the scan chain outputs of said N internal scan chains in said scan-based integrated circuit, and to switch said test responses controlled by one or more selection signals of said chain-switching matrix block, wherein said chain-switching matrix block comprises at least one combinational logic gate or switching component other than an XOR logic gate; and
   (b) a space compaction logic block connected to said chain-switching matrix block for compacting the outputs of said chain-switching matrix block to generate said compacted test responses at said M external scan outputs;
   wherein X-induced masking and aliasing is minimized, thus allowing fault effects to be observed and fault coverage increases accordingly, and
   wherein said selection signals are set to control values being determined algorithmically based on the relation between said unknown (X) values and fault effects coming from said N internal scan chain outputs for the purpose of minimizing X-induced masking and error masking.

2. The apparatus of claim 1, wherein said combinational logic gate or switching component other than an XOR gate includes at least one of a multiplexer (MUX), an AND gate, an OR gate, a NAND gate, a NOR gate, a buffer (BUF), an inverter (INV), and a switching component such as crossbar or modular switch, to switch, swap, or select said test responses at said N internal scan chains of said scan-based integrated circuit for connection to said space compaction logic block for generating said compacted test response.

3. The apparatus of claim 1, wherein said chain-switching matrix block further comprises dynamically switching N internal scan chain outputs in each shift cycle or conducting no switching in the whole shift operation, according to the control values in said selection signals.

4. The apparatus of claim 1, wherein said selection signals are selectively provided directly from one or more primary inputs or indirectly from a combinational or sequential circuit coupled to scan channels of an automatic test equipment (ATE).

5. The apparatus of claim 1, wherein said space compaction logic block further comprises using an XOR tree, an XOR Inject network, an X-tolerant compactor, or any other type of Space compactors, to conduct space compaction on said outputs of said chain-switching matrix block.

6. The apparatus of claim 1, further comprising a finite-memory compaction logic block to further compact said outputs of said space compaction logic block, wherein said finite-memory compaction logic block includes one or more storage elements, such as flip-flop or latch.

7. A method using a compactor driven by unknown (X) values for compacting test responses at the scan chain outputs of N internal scan chains in a scan-based integrated circuit to generate compacted test responses at M external scan outputs, where N>M, the X-driven compactor comprising a chain-switching matrix block and a space compaction logic block, said method comprising:
   (a) using said chain-switching matrix block to selectively switch said test responses in said N internal scan chain outputs to change the way said internal scan chain outputs are fed into said space compaction logic block, said switching operation being controlled by one or more selection signals of said chain-switching matrix block, wherein said chain-switching matrix block comprises at least one combinational logic gate or switching component other than an XOR logic gate; and
   (b) using said space compaction logic block connected to said chain-switching matrix block for compacting the outputs of said chain-switching matrix block to generate said compacted test responses at said M external scan outputs;
   wherein X-induced masking and aliasing is minimized, thus allowing fault effects to be observed and fault coverage increases accordingly, and
   wherein said selection signals are set to control values being determined algorithmically based on the relation between said unknown (X) values and fault effects coming from said N internal scan chain outputs for the purpose of minimizing X-induced masking and error masking.

8. The method of claim 7, wherein said combinational logic gate or switching component other than an XOR gate includes at least one of a multiplexer (MUX), an AND gate, an OR gate, a NAND gate, a NOR gate, a buffer (BUF), an inverter (INV), and a switching component such as crossbar or modular switch, to switch, swap, or select said test responses at said N internal scan chains of said scan-based integrated circuit for connection to said space compaction logic block for generating said compacted test response.

9. The method of claim 7, wherein said chain-switching matrix block further comprises dynamically switching N internal scan chain outputs in each shift cycle or conducting no switching in the whole shift operation, according to the control values in said selection signals.

10. The method of claim 7, wherein said selection signals are selectively provided directly from one or more primary inputs or indirectly from a combinational or sequential circuit coupled to scan channels of an automatic test equipment (ATE).

11. The method of claim 7, wherein said space compaction logic block further comprises using an XOR tree, an XOR Inject network, an X-tolerant compactor, or any other type of Space compactors, to conduct space compaction on said outputs of said chain-switching matrix block.

12. The method of claim 7, further comprising a finite-memory compaction logic block to further compact said outputs of said space compaction logic block, wherein said finite-memory compaction logic block includes one or more storage elements, such as flip-flop or latch.

* * * * *